US007966535B2

(12) United States Patent
Agarwal

(10) Patent No.: US 7,966,535 B2
(45) Date of Patent: Jun. 21, 2011

(54) SECURE SCAN DESIGN

(75) Inventor: Kanak Agarwal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 299 days.

(21) Appl. No.: 12/391,085

(22) Filed: Feb. 23, 2009

(65) Prior Publication Data

US 2010/0218054 A1   Aug. 26, 2010

(51) Int. Cl.
    *G01R 31/28* (2006.01)
(52) U.S. Cl. .................. 714/727; 714/729
(58) Field of Classification Search .................. 714/712, 714/724, 718, 726, 727, 729
See application file for complete search history.

(56) References Cited

U.S. PATENT DOCUMENTS

| | | | |
|---|---|---|---|
| 5,513,186 A * | 4/1996 | Levitt | 714/727 |
| 5,541,934 A * | 7/1996 | Marietta et al. | 714/712 |
| 6,983,405 B1 * | 1/2006 | Herron et al. | 714/726 |
| 6,996,758 B1 * | 2/2006 | Herron et al. | 714/726 |
| 2004/0085082 A1 | 5/2004 | Townley | |
| 2004/0153926 A1 | 8/2004 | Abdel-Hafez et al. | |
| 2004/0237015 A1 | 11/2004 | Abdel-Hafez et al. | |
| 2004/0268181 A1 | 12/2004 | Wang et al. | |
| 2005/0229123 A1 | 10/2005 | Wang et al. | |
| 2007/0296442 A1 | 12/2007 | Agarwal et al. | |
| 2008/0022173 A1 | 1/2008 | Chua-Eoan et al. | |
| 2008/0163362 A1 * | 7/2008 | Sesumi | 726/19 |
| 2008/0258750 A1 | 10/2008 | Agarwal et al. | |
| 2008/0278182 A1 | 11/2008 | Agarwal et al. | |

OTHER PUBLICATIONS

"Where is DFT Heading," by Rohit Kapur, PhD, EE-Evaluation Engineering, 2003.
"A Hierachial DFT Architecture for Chip, Board and System Test/Debug," by Charles A. Njinda, IEEE 2004 ITC International Test Conference Paper 37.1, pp. 1061-1071.

* cited by examiner

*Primary Examiner* — David Ton
(74) *Attorney, Agent, or Firm* — The Brevetto Law Group

(57) ABSTRACT

A circuit configuration for testing integrated circuitry featuring a number of system scan flip flops wired in series and connected to the integrated circuitry for inputting test signals and receiving test data back. At the front and back ends of the system scan flip flops there is an input multiplexer and an output multiplexer, each with a control input tied to a comparator. The multiplexers isolate the test circuitry until a predetermined scan key is received. When the comparator receives a k-bit scan key it enables the multiplexer to pass test data to the system scan flip flops.

17 Claims, 3 Drawing Sheets

SECURE SCAN DESIGN

BACKGROUND

1. Field of the Invention

The present invention relates to integrated circuit testing, and more specifically systems and methods for more secure integrated circuit testing.

2. Description of Related Art

As the performance and computational power of electronic devices steadily rises the circuit density and number of components increases as well. Processor, memory and logic circuits often include millions of gates. The vast numbers of components and high component densities pose a challenge in the testing and validation of large scale integrated circuits. These challenges have given rise to design-for-test (DFT) techniques. One DFT technique involves incorporating scan registers into the circuit design. The scan registers may be configured to include inputs to the combinational logic so that the state may be changed. The scan registers may also receive outputs from the combinational logic for evaluation of testing results. Typically, the DFT scan registers are configured to be controllably switched between a normal mode and a test mode. When in the test mode the scan registers receive an input test data signal, and in turn, provide an output signal with the test results.

One of the most popular DFT structures features a scan design with multiple externally accessible scan chains. Each scan chain has one or more scan cells coupled in series and embedded into the integrated circuit. Typically, a scan cell is a storage element such as a scan flip-flop or a scan latch. A scan structure may be used in conjunction with fault simulation and automatic test pattern generation (ATPG) to generate diagnostic test patterns that aid in production test and factory yield improvement.

Unfortunately, security and testability for integrated circuits tend to be fundamentally contradictory objectives. Scan based test is a powerful test technique but can sometimes make an otherwise secure IC vulnerable to malicious attacks. A conventional scan flip flop architecture is shown in FIG. 1A with scan flops 101-107. FIG. 1B depicts an example of typical circuitry for a single scan flop, for example, any one of scan flops 101-107. Conventional scan flop designs and scan based DFT architectures can sometimes provide full access to all flip flops in the scan chain, e.g., scan flops 101-107, thus providing a security weakness that can potentially be exploited. For example, an attacker can retrieve secret data by unloading the scan path during a cryptographic operation. It is possible to obtain secret cryptographic keys from repeated snapshots of the scan. In some instances secret data can be retrieved by loading a scan with known vectors and observing the side-channel responses. Faults can be injected in the system by loading a scan with malicious data. Another security weakness may occur at the scan interface where design or other intellectual property information can sometimes be obtained.

Circuit designers have attempted to increase the security of scan based architectures in a number of manners. One conventional method involves removal of the test interface by blowing out fused links after completion of manufacturing testing. While effective from a security standpoint, such measures to cut off the test interface eliminate any possibility of in-field testing. Other security enhancement techniques have been attempted, including encoding/decoding, scan chain scrambling and dummy insertion techniques. These conventional approaches cause significant design overhead and do not protect from all security threats. For example, despite these conventional measures an attacker can still load malicious data in the system.

What is needed is a way to provide secure scan capability while maintaining its testability benefits.

SUMMARY

Embodiments disclosed herein address the above stated needs by providing systems and methods for testing integrated circuitry. The test circuitry configuration includes a number of system scan memory elements which may be flip flops wired in series. The system scan elements are connected to the integrated circuitry to be tested. At the front and back ends of the system scan flip flops there is an input multiplexer and an output multiplexer, each with a control input tied to a comparator. The multiplexers isolate the test circuitry until an enable input is set to high and a predetermined scan key is received and verified by the comparator. When the enable input is set to high and the comparator receives a k-bit scan key it enables the multiplexer to pass test data to the system scan flip flops. Setting the enable input to low stops the multiplexer from passing further test data to the system scan flip flops.

BRIEF DESCRIPTION OF THE DRAWINGS

The accompanying drawings, which are incorporated in and constitute part of the specification, illustrate various embodiments of the invention. Together with the general description, the drawings serve to explain the principles of the invention. In the drawings.

DETAILED DESCRIPTION

Figure 1A:
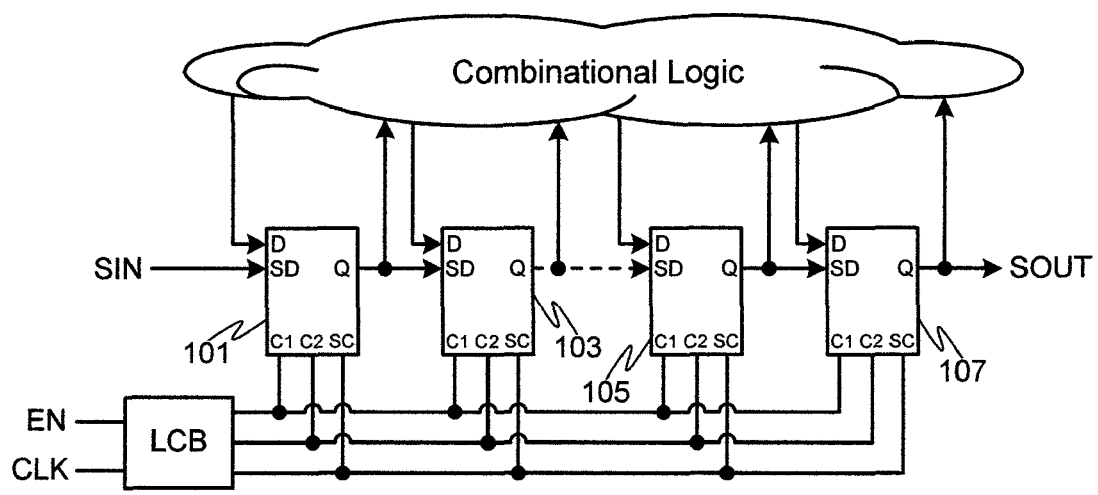
FIG. 1A depicts a conventional scan flop architecture.
Figure 1B:
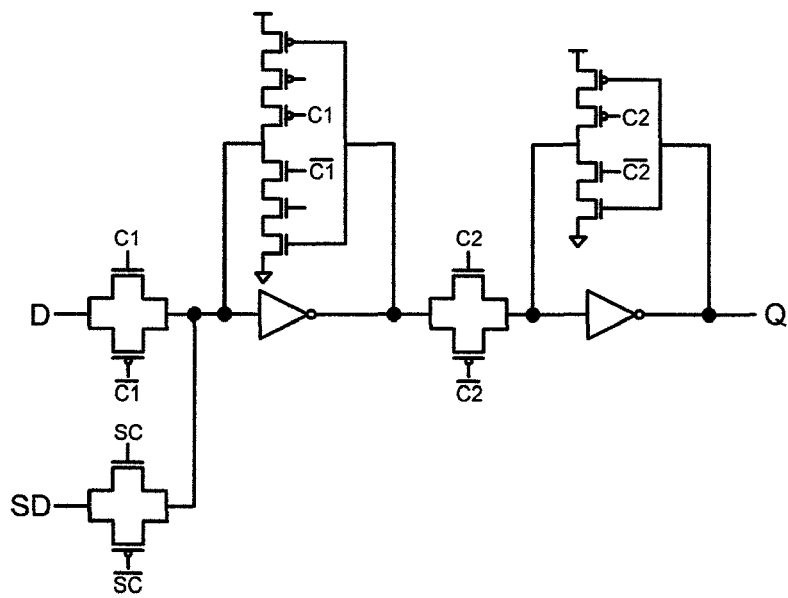
FIG. 1B depicts a conventional scan flop.
Figure 2:
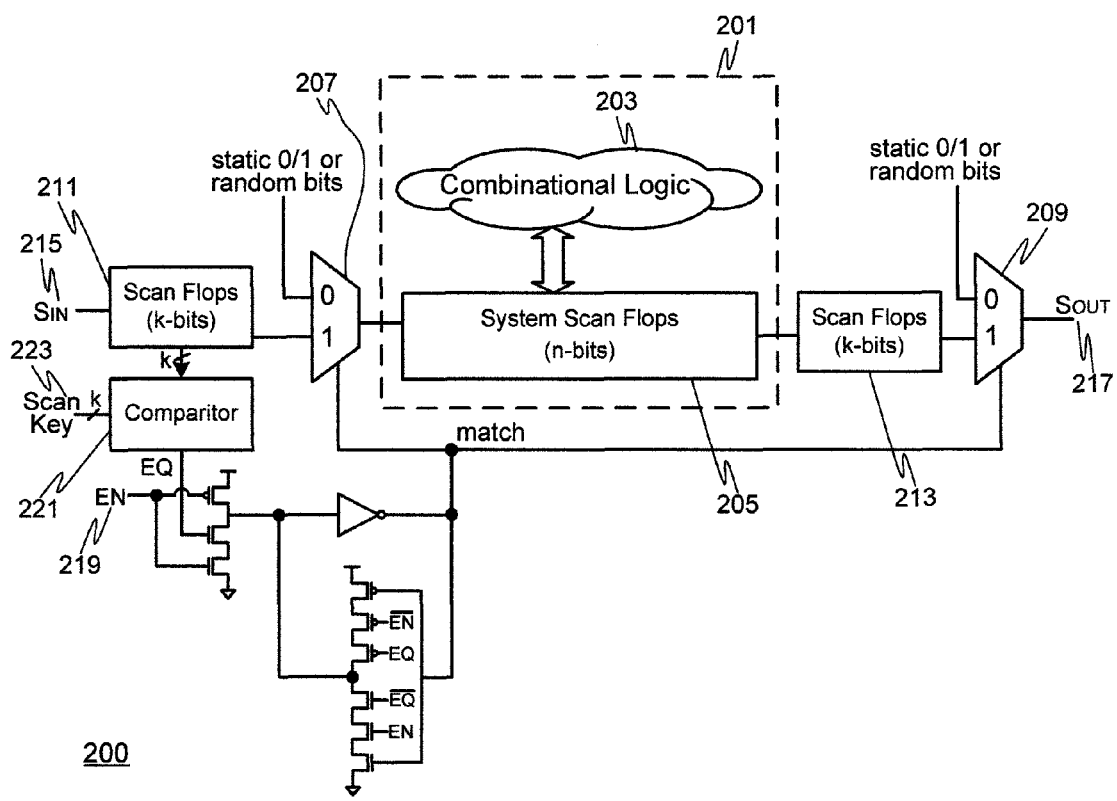
FIG. 2 depicts a secure scan design in accordance with various embodiments of the present invention.

FIG. 2 depicts a secure scan design in accordance with various embodiments of the present invention. The circuitry includes combinational logic 203 representing the integrated circuitry, gates or other logic being tested. The system scan flip flops 205 perform the scan testing by providing inputs to, and detecting outputs from, the combinational logic 203. In order to reduce the number of pins needed in an integrated circuit employing scan-based DFT, the system scan flip flops 205 may be configured as a series of scan registers connected in a chain such that scan inputs and outputs may be serially shifted through the chain to reduce the number of pins needed to fully test the integrated circuit. It should be noted that although FIG. 2 depicts flip flops (205, 211) various embodiments of the invention can be practiced with many other types of memory elements so long as the memory element is capable of being controlled to switch back and forth between two states which are stable. The circuitry shown within dotted line 201 of FIG. 2—that is, the combinational logic 203 and system scan flip flops 205—may, in some embodiments, be configured in the manner of the scan flop architecture depicted in FIG. 1. The embodiment of FIG. 2 differs from, that shown in FIG. 1 in a number of ways, for example, by providing additional circuitry to selectively supply or deny the test data input (and also prevent from the output being read) based on detecting whether the correct scan key has been received. Regarding the dotted line 201, it should be noted that this does not represent a chip boundary. Circuit lines passing through the dotted line 201 do not represent input or output leads on a chip. In at least some implementations all the circuitry depicted in FIG. 2 may be found on a single chip with inputs being provided by logic also found on the chip. In other implementations, one or more of the inputs or outputs (e.g., 215, 217, 219, or others) may represent an input lead or output lead of the chip.

The system scan flip flops block 205 is additionally connected to input mux (multiplexer) 207, output mux 209, k-bit scan input flip flops 211 and k-scan output flip flop 213. The scan input flip flops 211 may be referred to in more general terms as input scan memory elements, thus encompassing other implementations aside from flip flops, as is known by those of ordinary skill in the art. Similarly, the other flip flops depicted in FIG. 2 (205, 213) may also be implemented as memory elements. Although FIG. 2 is depicted with multiplexers (207, 209) the circuitry of various embodiments of the invention may be implemented with other types of combiner devices or controllable switches. Test data is applied to the scan input, $S_{IN}$ 215. Output from the scan flip flops 205 is provided at the scan output, $S_{OUT}$ 217. The system further comprises a control enable input 219, and a comparator 221 with a scan key input 223. The k-scan output flip flop 213 is depicted in the figure with one output connected to the mux 207 and another output connected to the comparator 221. Although the embodiment of FIG. 2 depicts a comparator, in practice any sort of scan key detector or other logic capable of detecting receipt of the scan key may be used in various embodiments of the invention. The k-scan input flip flop 211 may, in some implementations, be configured to supply an output to both the mux 207 and to the comparator 221 using the same circuit trace or line. In other implementations even though the mux 207 and the comparator 221 are connected to different pins of the k-scan input flip flop 211, the signals being provided to each component may be the same output due to the pins being internally connected within the flip flop 211.

Control enable input 219 being set to a logic low (EN=0) puts the system in the non-test mode. In the non-test mode the input select signal controlling mux 207 is set to block any data received at scan input $S_{IN}$ 215 from being passed beyond the mux 207, thus isolating the system scan flip flops 205. To initiate the process of testing the system should be set to the scan mode by applying the control enable input 219 to high (EN=1). However, even though the control enable input 219 is sent to high the test data won't be passed on from scan input $S_{IN}$ 215 to the system scan flops 205 until the proper scan key is received. The comparator 221 compares received data with the k-bit scan key 223 to determine whether the predefined k-bit scan key has been received at scan input $S_{IN}$ 215. Upon verifying receipt of the scan key the comparator output EQ goes to high, indicating a match. If the comparator output EQ becomes high due to a correct key, the data is latched in a latch with the match signal being one. Now the EQ signal can change but the match signal will stay at one until the EN signal is on. This may be important because in a serial scan chain, once we start to scan in a pattern, the initial k-bit registers will not always contain value same as the key. However, if we have entered the right key by scanning in the correct key bits in the first k-flops, it will activate the match signal which will then stay on irrespective of the future changes in the state of the k-bit scan flops. This, in turn, applies a logical high to the input mux 207 select signal. With the mux 207 select signal set high the test data applied to scan input $S_{IN}$ 215 is provided to the system scan flops 205 in order to perform scan testing of the combinational logic 203. The output mux 209 and output data 217 are turned on in a similar manner as well.

Some embodiments may also be provided with a k-scan output flip flop 213 and output mux 209, as depicted in FIG. 2. As shown in the figure the control enable of output mux 209 may be tied to that of input mux 207 so as to enable the two muxes at the same time with the same enable signal. Alternatively, other embodiments may provide separate enablement circuitry for the input and output muxes. In the embodiment of FIG. 2, once input mux 207 and output mux 209 are enabled, the system can begin loading and unloading the system scan flops 205.

Figure 3:
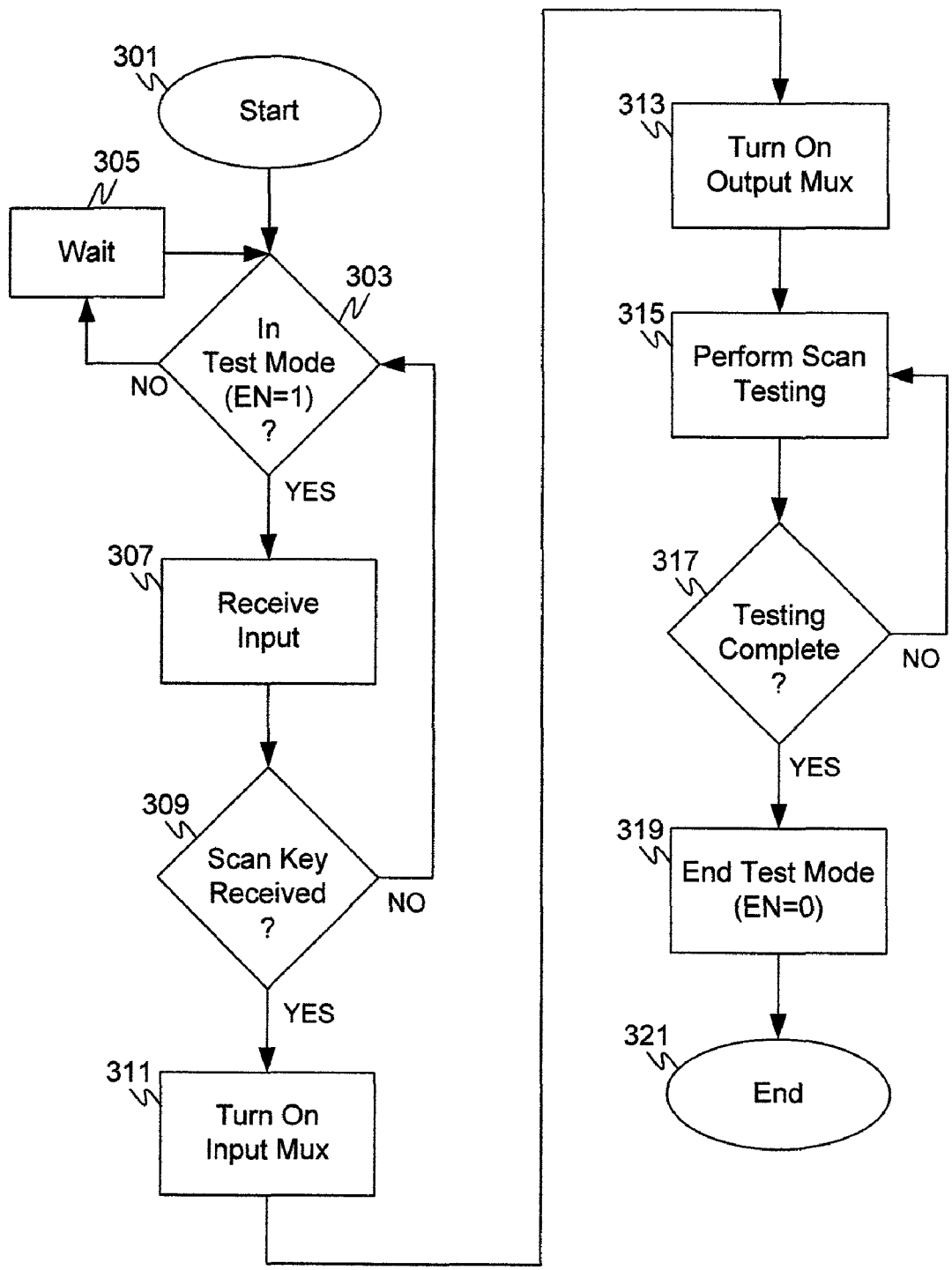
FIG. 3 is a flowchart depicting the use of the secure scan design in accordance with various embodiments of the invention.

FIG. 3 is a flowchart depicting the use of the secure scan design in accordance with various embodiments of the invention. The method begins at 301 and proceeds to 303 to determine whether the system—that is, the integrated circuit to be tested—is set to test mode. This may be done by setting a control enable input such as 219 of FIG. 2 to high (EN=1). Other like types of circuitry or logic may be used to selectively enable the test mode, as would be known by those of ordinary skill in the art. If it is determined in block 303 that the system is not in test mode (e.g., EN=0), then the method loops back from 303 in accordance with the NO branch to 305 to wait for an indication of EN=1 or other such control to initiate test mode. Once it is determined that the system is in test mode the method proceeds from 303 along the YES branch to 307.

In block 307 the system receives a test data input, for example, an input to $S_{IN}$ 215 of FIG. 2, and then the method proceeds to 309. In block 309 it is determined whether the predetermined scan key has been received. The scan key operates to unlock access to the system scan flops. In at least some embodiments the scan key is compared to a previously stored scan key, for example, through the use of a comparator such as the comparator 221 of FIG. 2. If the scan key for initiating testing has not yet been received the method loops from 309 along the NO branch back to 303 to begin the process anew. However, if it is determined in 309 that the scan key has been correctly received the method proceeds from 309 along the YES branch to 311. The system depicted in FIG. 2 is configured so that if the correct scan key is not received, then the mux control signal remains zero. Hence, the mux passes either static 0/1 or random bits as input to the system flops, and similarly outputs static 0/1 or random bits. The static 0/1 or random bits is provided to one input of input mux 207 and also to output mux 209. From a security point of view, this is useful because even though the correct key may not have been received yet the scan chain will still be loaded, but with inputs beyond the control of an attacker. Similarly the scan output dumps out bits also beyond the control of the attacker.

In 311 of FIG. 3 the input MUX is controlled so as to begin providing access to the system scan flip flops. Referring again to FIG. 2, this may be done once the comparator 221 indicates receipt of the scan key in 309 by outputting EQ=1 from the comparator 221 to control the input mux 207 and begin passing input test data. In this way the system scan flops 205 can begin loading test data received at $S_{IN}$. The method proceeds from 311 to 313 to set the output MUX 209 to output test data from the scan flops. Depending upon the specifics of the implementation the output MUX may be controlled with the same control line as the input MUX. Once access is provided to the system scan flip flops 205 the method proceeds to 315 to perform testing of the integrated circuits a manner akin to conventional DFT scan systems.

The method then proceeds to 317 to determine whether circuitry testing is complete so the IC circuitry can again be isolated for security purposes. This may be done by setting the control enable input 219 to a logical low (EN=0). In some implementations the end of testing may be indicated by a predetermined code or input data fed to the scan input, $S_{IN}$ 215. If it is determined that testing is not complete the method proceeds from 317 along the NO path back to 315. However, if it is determined in 317 that IC testing has reached completion the method proceeds from 317 along the YES path to 319.

In 319 the input and output muxes are both set to block access to the system scan flops. That is, the input and output muxes are controlled to quit passing data so as to again isolate the system scan flip flops. This is done by controlling the circuitry to set the input mux select signal is set to zero. For example, the EQ output from comparator 221 may be set to a logical low output level. Once the muxes are controlled to again isolate the system scan flip flops the method proceeds from 319 to 321 and ends.

Various activities of the methods may be included or excluded as described above, or performed in a different order, with the rest of the activities still remaining within the scope of at least one exemplary embodiment. For example, block 313 may be performed before block 311 to turn the output mux ON before the input mux, or blocks 311 and 313 may be performed at the same time. In some embodiments the output mux may be eliminated altogether. It should be noted that in some embodiments no data is loaded to the scan flops 211 until a scan key has been received and verified. This may be implemented by performing block 307 of FIG. 3 after it is determined that the scan key is properly received in block 309.

The invention may be implemented with any sort of processing units, processors controllers and/or logic or circuitry capable of performing the stated functions and activities. A processing unit in accordance with at least one exemplary embodiment can operate computer software programs stored (embodied) on computer-readable medium such as the computer's memory (e.g. hard disk drive or RAM memories), CD, flash memory, or any other suitable computer readable medium recognized by those of ordinary skill in the art. The computer software programs can aid or perform the steps and activities described above. For example computer programs in accordance with at least one exemplary embodiment may include: source code for receiving a data input at an input scan memory element, source code for providing the data input from a controllable input switch such as a multiplexer, source code for providing the data input from the input scan memory element to a scan key detector such as a comparator, and source code that provides a control signal causing the controllable input switch to pass the data input to the system scan memory elements in response to detecting the scan key. There are many further source codes that may be written to perform the steps and procedures disclosed above, and these are intended to fall within the scope of various exemplary embodiments.

The use of the word "exemplary" in this disclosure is intended to mean that the embodiment or element so described serves as an example, instance, or illustration, and is not necessarily to be construed as preferred or advantageous over other embodiments or elements.

The description of the various exemplary embodiments provided above is illustrative in nature and is not intended to limit the invention, its application, or uses. Thus, variations that do not depart from the gist of the invention are intended to be within the scope of the embodiments of the present invention. Such variations are not to be regarded as a departure from the spirit and scope of the present invention.

What is claimed is:

1. A test circuit for testing integrated circuitry comprising:
a plurality of system scan memory elements connected to said integrated circuitry, the plurality of system scan memory elements including a first system scan memory element;
a controllable input switch with an output connected to said first system scan memory element;
one or more input scan memory elements disposed to receive input test data and being configured with an output connected to said controllable input switch; and
a scan key detector comprising an input connected to said output of said one or more input scan memory elements, said scan key detector being configured to detect a k-bit scan key received from said one or more input scan memory elements;
wherein, in response to detecting receipt of the k-bit scan key, said scan key detector provides a control signal which is required to control the controllable input switch to provide said input test data to the plurality of system scan memory elements.

2. The test circuit of claim 1, wherein said plurality of system scan memory elements are connected in series, said plurality of system scan memory elements being respectively connected to a plurality of points within said integrated circuitry, the plurality of system scan memory elements including a first system scan memory element.

3. The test circuit of claim 1, wherein said controllable input switch is an input multiplexer.

4. The test circuit of claim 3, further comprising:
one or more output scan memory elements disposed to provide output test data; and
an output multiplexer connected to said one or more output scan memory elements;
wherein the output multiplexer is controlled to provide output test data in response to said scan key detector detecting receipt of the k-bit scan key.

5. The test circuit of claim 4, wherein said plurality of system scan memory elements is a plurality of flip flops, said one or more input scan memory elements is one or more input scan flip flops, and said one or more output scan memory elements is one or more output scan flip flops.

6. The test circuit of claim 1, wherein the input is a first input and said scan key detector is a comparator that includes a second input connected to a k-bit scan key source.

7. The test circuit of claim 1, wherein said control signal is a first control signal, the test circuit further comprising:
a control enable input connector configured to receive a second control signal;
wherein said first control signal and said second control signal are both required to control the controllable input switch to provide said input test data to the plurality of system scan memory elements, the said second control signal being a test mode enable signal.

8. The test circuit of claim 1, wherein receipt of the k-bit scan key is verified while the second control signal is set high causes said controllable input switch to provide the input test data to the plurality of system scan memory elements; and
wherein setting the second control signal to low causes said controllable input switch to stop providing the input test data to the plurality of system scan memory elements.

9. A method of testing integrated circuitry wherein a plurality of system scan memory elements is connected to said integrated circuitry, the method comprising:
receiving a data input at an input scan memory element;

providing said data input from said input scan memory element to a controllable input switch;

providing said data input from said input scan memory element to a scan key detector;

in response to said scan key detector detecting a k-bit scan key, providing a control signal required for controlling said controllable input switch to pass the data input to said plurality of system scan memory elements.

10. The method of claim 9, wherein said plurality of system scan memory elements are connected in series, said plurality of system scan memory elements being respectively connected to a plurality of points within said integrated circuitry.

11. The method of claim 9, wherein said scan key detector is a comparator.

12. The method of claim 9, wherein said controllable input switch is an input multiplexer.

13. The method of claim 9, wherein said control signal is a first control signal, the method further comprising:

receiving a second control signal input;

wherein said first control signal and said second control signal are both required to control the controllable input switch to provide said input test data to the plurality of system scan memory elements, the said second control signal being a test mode enable signal.

14. The method of claim 13, wherein receipt of the k-bit scan key is verified while the second control signal is set high causes said controllable input switch to provide the input test data to the plurality of system scan memory elements, the method further comprising:

setting the second control signal to low to cause said controllable input switch to stop providing the input test data to the plurality of system scan memory elements.

15. Control circuitry configured to control a test circuit for testing integrated circuitry connected to a plurality of system scan memory elements including a first system scan memory element, said control circuitry comprising:

a first input connected to a scan key detector configured to indicate receipt of a predefined scan key;

a second input connected to an enable control line; and an output connected to a controllable input switch with an output connected to said first system scan memory element;

wherein, in response to receipt of both a first signal indicating verification of a k-bit scan key by the scan key detector and a second control signal set high at the second input, said controllable input switch is turned on to provide input test data to the plurality of system scan memory elements.

16. The control circuitry of claim 15, wherein said controllable input switch is an input multiplexer; and wherein said scan key detector is a comparator that includes a scan key input connected to a k-bit scan key source.

17. The control circuitry of claim 15, wherein setting the enable control line to low causes said controllable input switch to stop providing the input test data to the plurality of system scan memory elements.

* * * * *